(12) United States Patent
Chen et al.

(10) Patent No.: US 9,253,898 B2
(45) Date of Patent: Feb. 2, 2016

(54) RIGID FLEX BOARD MODULE AND THE MANUFACTURING METHOD THEREOF

(71) Applicant: UNIMICRON TECHNOLOGY CORP., Taoyuan Hsien (TW)

(72) Inventors: Chi-Shiang Chen, New Taipei (TW); Hsiu-Ching Hu, Taoyuan County (TW); Kun-Wu Li, Hsinchu County (TW); Fang-Ping Wu, Taoyuan County (TW)

(73) Assignee: Unimicron Technology Corp., Taoyuan Hsien (TW)

( * ) Notice: Subject to any disclaimer, the term of this patent is extended or adjusted under 35 U.S.C. 154(b) by 98 days.

(21) Appl. No.: 14/093,660

(22) Filed: Dec. 2, 2013

(65) Prior Publication Data
US 2015/0053463 A1    Feb. 26, 2015

(30) Foreign Application Priority Data
Aug. 26, 2013   (TW) .............................. 102130435 A (51) Int. Cl.
*H05K 1/00* (2006.01)
*H05K 3/46* (2006.01)
(Continued)

(52) U.S. Cl.
CPC ............ *H05K 3/4694* (2013.01); *H05K 3/4691* (2013.01); *H05K 1/0278* (2013.01); *H05K 1/185* (2013.01); *H05K 3/005* (2013.01);
(Continued)

(58) Field of Classification Search
CPC ............. H01K 1/00; H01K 1/02; H01K 1/03; H01K 1/09; H01K 1/11; H01K 1/14; H01K 3/00; H01K 3/10; H01K 3/20; H01K 3/36; H01K 3/46; H01L 21/58; H01L 23/48

USPC ................. 174/250, 254–261, 263, 264, 378; 361/695, 709, 749, 753, 792, 804; 428/220, 323, 473.5; 29/830, 831, 852; 257/686, 692, 783
See application file for complete search history.

(56) References Cited

U.S. PATENT DOCUMENTS 4,872,934 A * 10/1989 Kameda ......................... 156/250
4,931,134 A * 6/1990 Hatkevitz et al. ............... 216/17
(Continued)

FOREIGN PATENT DOCUMENTS

| CN | 101272660 | 9/2008 |
| CN | 202424204 | 9/2012 |
| TW | 201029540 A | 8/2010 |

OTHER PUBLICATIONS

Communication From the Taiwan Patent Office Regarding a Counterpart Foreign Appliction Dated (Taiwan Year 103) Dec. 1, 2014.

*Primary Examiner* — Xiaoliang Chen
(74) *Attorney, Agent, or Firm* — Rosenberg, Klein & Lee (57) ABSTRACT

A rigid flex board module includes a rigid flex circuit board and a high-density interconnected circuit board. The rigid flex circuit board includes a flexible circuit board, a first rigid circuit board and a first adhesive layer. The flexible circuit board includes a bending portion and a jointing portion connected to the bending part. The rigid flex circuit board is disposed on the jointing portion to expose the bending portion. The first rigid circuit board electrically connects with the flexible circuit board. The first adhesive layer connects the first rigid circuit board and the jointing portion. The high-density interconnected circuit board is disposed in the first rigid circuit board and is electrically connected to the first rigid circuit board.

6 Claims, 10 Drawing Sheets

(51) Int. Cl.
*H05K 1/02* (2006.01)
*H05K 1/18* (2006.01)
*H05K 3/00* (2006.01)

(52) U.S. Cl.
CPC ............ *H05K 3/007* (2013.01); *H05K 3/0035* (2013.01); *H05K 3/0047* (2013.01); *H05K 2201/048* (2013.01); *H05K 2203/0384* (2013.01); *H05K 2203/167* (2013.01)

(56) References Cited

U.S. PATENT DOCUMENTS

| | | | | |
|---|---|---|---|---|
| 5,428,190 | A | * | 6/1995 | Stopperan ..................... 174/261 |
| 5,688,584 | A | * | 11/1997 | Casson et al. ................. 428/209 |
| 8,020,292 | B1 | * | 9/2011 | Kumar et al. .................... 29/852 |
| 8,500,938 | B2 | * | 8/2013 | Stahr et al. ..................... 156/256 |
| 2001/0040794 | A1 | * | 11/2001 | Shimizu et al. ............... 361/749 |
| 2003/0116345 | A1 | * | 6/2003 | Shimzu et al. ................. 174/255 |
| 2003/0173105 | A1 | * | 9/2003 | Kondo et al. .................. 174/255 |
| 2004/0218361 | A1 | * | 11/2004 | Lin et al. ........................ 361/695 |
| 2006/0083939 | A1 | * | 4/2006 | Dunbar et al. .............. 428/473.5 |
| 2006/0169485 | A1 | * | 8/2006 | Kawaguchi et al. .......... 174/254 |
| 2006/0286364 | A1 | * | 12/2006 | Lee et al. ....................... 428/323 |
| 2006/0286365 | A1 | * | 12/2006 | Lee et al. ....................... 428/323 |
| 2007/0012475 | A1 | * | 1/2007 | Kawaguchi et al. .......... 174/255 |
| 2007/0052084 | A1 | * | 3/2007 | Kennedy ....................... 257/686 |
| 2008/0093118 | A1 | * | 4/2008 | Takahashi et al. ............. 174/264 |
| 2008/0105456 | A1 | * | 5/2008 | Kawaguchi et al. .......... 174/255 |
| 2008/0107802 | A1 | * | 5/2008 | Kawaguchi et al. .......... 427/97.2 |
| 2009/0079956 | A1 | * | 3/2009 | Kennedy et al. .............. 356/4.01 |
| 2009/0229876 | A1 | * | 9/2009 | Takahashi ...................... 174/378 |
| 2009/0263639 | A1 | * | 10/2009 | Dunbar et al. ................. 428/220 |
| 2009/0283301 | A1 | * | 11/2009 | Takahashi ...................... 174/254 |
| 2010/0065313 | A1 | * | 3/2010 | Takeuchi et al. .............. 174/258 |
| 2010/0139967 | A1 | * | 6/2010 | Takahashi ...................... 174/262 |
| 2010/0263919 | A1 | * | 10/2010 | Lee et al. ....................... 174/257 |
| 2011/0019383 | A1 | * | 1/2011 | Aoyama et al. ............... 361/792 |
| 2011/0126408 | A1 | * | 6/2011 | Antesberger et al. ........... 29/831 |
| 2011/0127664 | A1 | * | 6/2011 | Antesberger et al. .......... 257/692 |
| 2011/0240215 | A1 | * | 10/2011 | Cheng ............................ 156/249 |
| 2011/0283532 | A1 | * | 11/2011 | Takahashi ........................ 29/829 |
| 2011/0289774 | A1 | * | 12/2011 | Kumar et al. .................... 29/852 |
| 2011/0308079 | A1 | * | 12/2011 | Takahashi et al. ............... 29/829 |
| 2012/0008290 | A1 | * | 1/2012 | Takahashi et al. ............. 361/749 |
| 2012/0008296 | A1 | * | 1/2012 | Aoyama et al. ............... 361/792 |
| 2012/0008297 | A1 | * | 1/2012 | Aoyama et al. ............... 361/792 |
| 2012/0012368 | A1 | * | 1/2012 | Takahashi ...................... 174/254 |
| 2012/0081864 | A1 | * | 4/2012 | Sakurai et al. ................. 361/753 |
| 2012/0125664 | A1 | * | 5/2012 | Niemi et al. ................... 174/250 |
| 2013/0014982 | A1 | * | 1/2013 | Segawa et al. ................ 174/263 |
| 2013/0087375 | A1 | * | 4/2013 | Tsunoi ........................... 174/260 |
| 2013/0153269 | A1 | * | 6/2013 | Takahashi et al. ............. 174/254 |
| 2014/0055974 | A1 | * | 2/2014 | Hansen .......................... 361/804 |
| 2014/0069696 | A1 | * | 3/2014 | Rothkopf et al. .............. 174/254 |
| 2014/0131897 | A1 | * | 5/2014 | Yu et al. ......................... 257/783 |
| 2015/0029669 | A1 | * | 1/2015 | Liskow et al. ................. 361/709 |

* cited by examiner

FIG.3 rigid_flex_board_module.md
RIGID FLEX BOARD MODULE AND THE MANUFACTURING METHOD THEREOF

BACKGROUND OF THE INVENTION

1. Field of the Invention

The instant disclosure relates to a rigid flex board module and the manufacturing method of the same; in particular, to a rigid flex board module including a high-density interconnected circuit board and the manufacturing method of the same.

2. Description of Related Art

Conventional rigid flex board module includes a flexible circuit board, a rigid circuit board and an adhesive layer. The flexible circuit board typically includes a bending portion and a jointing portion connected to the bending portion. The rigid circuit board is disposed on the jointing portion and exposes the bending portion to provide flexible yet rigid properties.

The trend of 3C product such as smart phones, liquid crystal displays, PC tablets and laptops has been toward multifunction, so that the high density circuitry in rigid flex board modules is indispensable.

SUMMARY OF THE INVENTION

The object of the instant disclosure is to provide a rigid flex board module having partial high-density interconnected circuit design and a manufacturing method for the rigid flex board module.

In order to achieve the aforementioned objects, according to an embodiment of the instant disclosure, a rigid flex board module is provided, which includes a rigid flex circuit board and a high-density interconnected circuit board. The rigid flex circuit board includes a flexible circuit board, a first rigid circuit board and a first adhesive layer. The flexible circuit board includes a bending portion and a jointing portion connected to the bending portion. The first rigid circuit board is disposed on the jointing portion exposing the bending portion. The first rigid circuit board is electrically connected to the flexible circuit board. The first adhesive layer is connected to the first rigid circuit board and the jointing portion. The high-density interconnected circuit board is disposed in and electrically connected to the first rigid circuit board.

The instant disclosure also provides a manufacturing method for providing the rigid flex board module. The method includes providing a rigid flex initial substrate including a flexible circuit board, a first rigid substrate, and a first insulating layer. The flexible circuit board includes a bending portion and a jointing portion connected to the bending portion. The first rigid substrate is arranged above the flexible circuit board and the first insulating layer connects the first rigid substrate and the flexible circuit board. A second opening is formed on the rigid flex initial substrate and through the first rigid substrate and the first insulating layer. A high-density interconnected circuit layer is disposed in the second opening. A pair of insulating adhesive layers is formed on two sides of the rigid flex initial substrate. A pair of multi-layer circuit layers is formed on the insulating adhesive layers. A plurality of conductive posts is formed in the insulating adhesive layers such that the multi-layer circuit layers, the high-density interconnected circuit layer, and the rigid flex initial substrate are electrically connected to each other. Successively, portions of the first rigid substrate, portions of the first insulating layer, portions of the insulating adhesive layer, and portions of the multi-layer circuit layer above the bending portion are removed.

In summary, the instant disclosure provides a rigid flex board module and the manufacturing method for the same. The rigid flex board module includes a rigid flex circuit board and a high-density interconnected circuit board. The high-density interconnected circuit board is disposed in the rigid flex circuit board where high density circuit design is preferred. Since the high-density interconnected circuit board and the rigid flex circuit board in the manufacturing method of the instant disclosure can be separately designed, circuitry can first be designed on the high-density interconnected circuit board to reduce poor overall yield due to poor installation of the high-density interconnected circuit board in the rigid flex circuit board, thus increase yield.

In order to further understand the instant disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

The aforementioned illustrations and detailed descriptions are exemplarities for the purpose of further explaining the scope of the instant disclosure. Other objectives and advantages related to the instant disclosure will be illustrated in the subsequent descriptions and appended drawings.

Figure 1A:
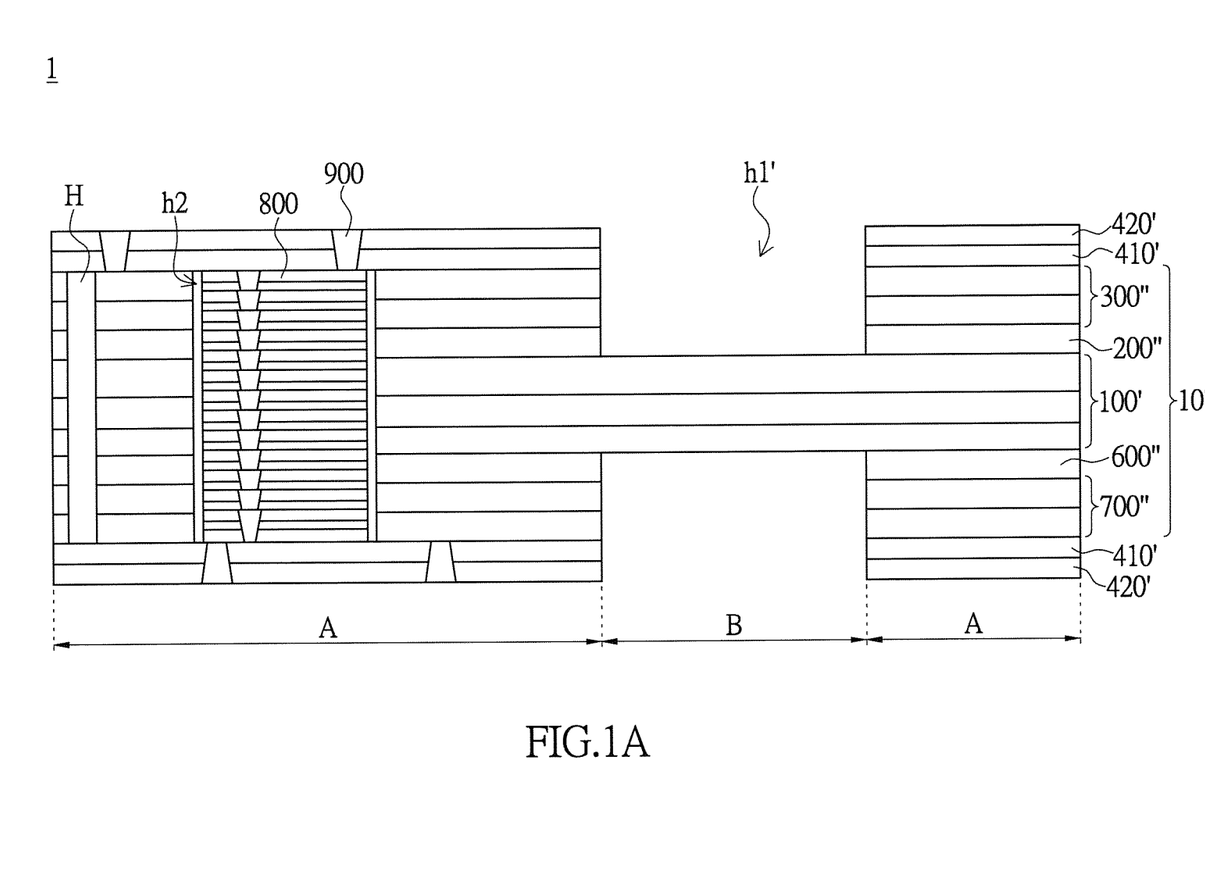
FIG. 1A is a cross-section view of a rigid flex board module in accordance with a first embodiment of the instant disclosure.

Please refer to FIG. 1A. A rigid flex module 1 includes a rigid flex circuit board 10", a high-density interconnected circuit board 800, two pairs of multi-layer circuit layers 410', 420', a plurality of conductive posts 900, and a through hole H.

As shown in FIG. 1A, the rigid flex circuit board 10" also includes a flexible circuit board 100', a first adhesive layer 200", a first rigid circuit board 300", a second adhesive layer 600", and a second rigid circuit board 700". The flexible circuit board 100' includes a bending portion B and a jointing portion A connected to the bending portion B. The first rigid circuit board 300" and the second rigid circuit board 700" are disposed on two sides of the flexible circuit board 100'. Specifically, the first rigid circuit board 300" and the second rigid circuit board 700" are disposed on two sides of the jointing portion A of the flexible circuit board 100', which exposes the bending portion B. The first adhesive layer 200" is connected to the first rigid circuit board 300" and one of the sides of the jointing portion A, and the second adhesive layer 600" is connected to the second rigid circuit board 700" and the other side of the jointing portion A.

Moreover, in the instant embodiment, the quantity of the jointing portion A is two and the quantity of the bending portion B is one, in which the one bending portion B is arranged between the two jointing portions A. However, the configuration of the bending and jointing portions A, B is not limited hereto. In another embodiment, one jointing portion A is connected to one bending portion B. In addition, the respective quantity of both the jointing portion A and bending portion B can be more than one, and one bending portion B is arranged between two jointing portion.

Furthermore, in the instant embodiment, the rigid flex circuit board 10" includes the flexible circuit board 100', the first rigid circuit board 300", and the second rigid circuit board 700", where the flexible circuit board 100' is arranged between the first rigid circuit board 300" and the second rigid circuit board 700". However, the quantities of the flexible circuit board and the rigid circuit board are not limited in the instant disclosure. In another embodiment, the flexible circuit board may only include one layer of flexible circuit board, and one layer of rigid circuit board arranged on top of the jointing portion of the flexible circuit board.

Notably, the flexible circuit board 100", the first rigid circuit board 300" and the second rigid circuit board 700" include a plurality of insulating layers and circuit layers (one layer of insulating layer and one layer of circuit layer are shown in figures). The first adhesive layer 200" and the second adhesive layer 600" can be made of polypropylene (PP) resin, but not limited hereto. The first adhesive layer 200" and the second adhesive layer 600" can also be made of other polymer adhesives.

In FIG. 1A, the high-density interconnected circuit board 800 is disposed in the rigid flex circuit board 10" and is electrically connected to the first rigid circuit board 300", the flexible circuit board 100' and the second rigid circuit board 700". Specifically, the rigid flex module 1 has a second opening h2. The second opening h2 is formed through the first rigid circuit board 300", the flexible circuit board 100' and the second rigid circuit board 700". Moreover, the second opening h2 may have a cross-sectional shape of a non-point symmetric pattern, such as the shape of a lightning bolt, whereas the high-density interconnected circuit board 800 has a cross-sectional shape identical to that of the second opening h2. Since the cross-sectional shape of the second opening h2 is a non-point symmetric pattern, the high-density interconnected circuit board 800 can be properly disposed in the second opening h2, which facilitates the conductive posts 900 formed downstream can be properly and electrically connected to the pads (not labeled in figures) on the high-density interconnected circuit board 800.

Notably, the high-density interconnected circuit board 800 is formed by a plurality of insulating layers and circuit layers. In terms of thickness of the high-density interconnected circuit board 800, the total number of circuit layer is larger than the total number of the rigid flex circuit board 10", or larger than the total number of the first rigid circuit board 300", the flexible circuit board 100', and the second rigid circuit board 700" combined. In other words, the density of the circuit layer of the high-density interconnected circuit board 800 is larger than the circuit layer density of the rigid flex circuit board 10". In addition, the high-density interconnected circuit board 800 in the instant embodiment amounts to one as shown in FIG. 1A. However, in another embodiment, the quantity of the high-density interconnected circuit board 800 is more than one, and not limited hereto.

Moreover, the high-density interconnected circuit board 800 is disposed in the rigid flex circuit board 10" in the instant embodiment. In practice, the high-density interconnected circuit board 800 and the rigid flex circuit board 10" can be separately designed. The design of the rigid flex circuit board 10" can be relatively simple, in which the second opening h2 is formed in the rigid flex circuit board 10" at a region where dense circuitry may be required, then separately design the high-density interconnected circuit board 800, and dispose the high-density interconnected circuit board 800 into the second opening h2. The rigid flex board module 1 of the instant disclosure can first select the high-density interconnected circuit board 800, which reduces poor installation of the high-density interconnected circuit board 800 and increases yield, whereas the conventional arts, the high-density interconnected circuit board 800 is directly design on the module to provide dense circuitry.

Furthermore in FIG. 1A, the rigid flex board module 1 further includes two pairs of multi-layer circuit layers 410', 420', the conductive posts 900 and the through hole H. The multi-layer circuit layers 410' are disposed on two sides of both the rigid flex circuit board 10' and the high-density interconnected circuit board 800. In other words, the first rigid circuit board 300", the flexible circuit board 100', the second rigid circuit board 700", and the high-density interconnected circuit board 800 are arranged between the pair of multi-layer circuit layers 410'. Specifically, one of the multi-layer circuit layers 410' is attached to one side of the first rigid circuit board 300" and one side of the high-density interconnected circuit board 800, whereas the other multi-layer circuit layer 410' is attached to one side of the second rigid circuit board 700", and the other side of the high-density interconnected circuit board 800. Moreover, the multi-layer circuit layers 410' expose the bending portion B.

Notably, the multi-layer circuit layers 410' includes at least one adhesive layer and at least one circuit layer (not shown in figures). The adhesive layer is made of polypropylene or other polymer adhesives, but not limited hereto. The multi-layer circuit layers 420' are respectively disposed on the multi-layer circuit layers 410' exposing the bending portion B. The conductive posts 900 provide electrical connectivity between the multi-layer circuit layers 410', the multi-layer circuit layers 420', the high-density interconnected circuit board 800, the first rigid circuit board 300", and the second rigid circuit board 700". The through hole H passes through the rigid flex circuit board 10" in order to interconnect internal circuits of the rigid flex circuit board 10".

Figure 1B:
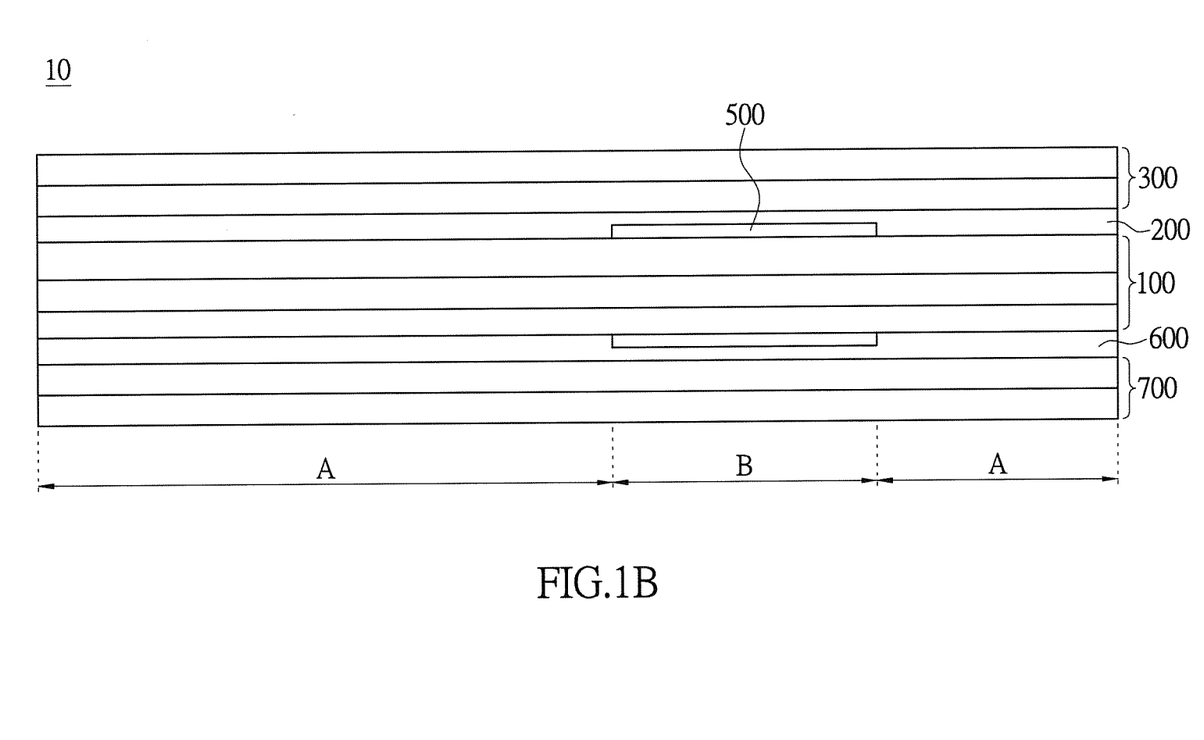
FIG. 1B to 1G are cross-sectional views of a manufacturing method for the rigid flex board module in accordance with the first embodiment of the instant disclosure.

Aforementioned is the structure of the rigid flex board module 1 of the instant embodiment. The instant disclosure also includes a manufacturing method for the rigid flex board module 1. Please refer to FIG. 1B to 1G. As shown in FIG. 1B, the first step includes providing a rigid flex initial substrate 10. The rigid flex initial substrate 10 includes a flexible circuit board 100, a pair of release layers 500, a first insulating layer 200, a first rigid substrate 300, a second insulating layer 600, and a second rigid substrate 700. The flexible circuit board 100 includes a bending portion B, and a jointing portion A connected to the bending portion B. The release layers 500 are respectively disposed on two sides of the flexible circuit board 100 covering the bending portion B. The first rigid substrate 300 and the second rigid substrate 700 are respectively disposed on two release layer 500s and the flexible circuit board 100 covers the jointing portion A and the bending portion B of the flexible circuit board 100. The first insulating layer 200 is connected between the first rigid substrate 300 and the flexible circuit board 100, whereas the second insulating layer 600 is connected between the second rigid substrate 700 and the flexible circuit board 100.

Notably, the flexible circuit board 100, the first rigid substrate 300 and the second rigid substrate 700 include a plurality of insulating layers and circuit layers (figure shows only one insulating layer and one circuit layer).

In addition, one bending portion B is arranged between two jointing portions in the instant embodiment, but not limited hereto. In another embodiment, only one jointing portion A is connected to one bending portion B. Besides, the quantities of the jointing portion A and the bending portion B can be more than one, as long as one bending portion B is arranged between two jointing portions A.

Moreover, the rigid flex initial circuit board 10 includes the first rigid substrate 300, the second rigid substrate 700, and the flexible circuit board 100 arranged between the first and second rigid substrate 300, 700 in the instant embodiment. However, the quantities of the flexible circuit board 100 and the rigid circuit boards are not limited to examples provided herein. In another embodiment, the rigid flex initial circuit board 10 can only include a layer of rigid substrate and a layer of flexible circuit board.

Figure 1C:
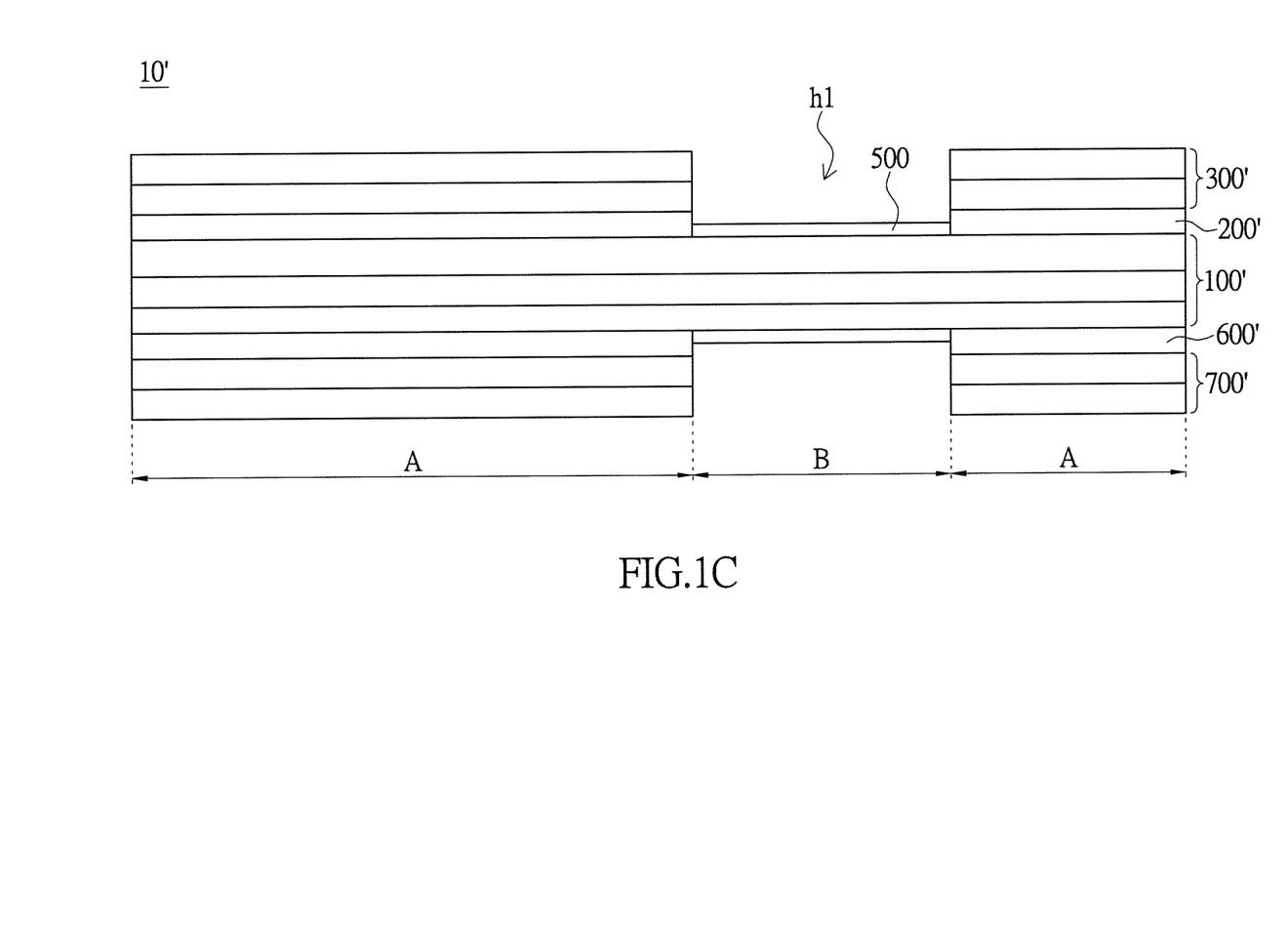

Please refer to FIG. 1C. A pair of first openings h1 is formed in the rigid flex initial substrate 10' corresponding to the position of the bending portion B. As shown in FIG. 1C, one of the first openings h1 is formed through the first rigid substrate 300' and the first insulating layer 200' to expose one of the sides of one release layer 500 on the flexible circuit board 100. The other first opening h1 is formed through the second rigid substrate 700' and the second insulating layer 600' to expose one of the sides of another release layer 500. In other words, the first openings h1 expose two sides of the bending portion B of flexible circuit board 100 while the pair of release layers 500 can protect the flexible circuit board where the bending portion B is located.

Notably, portions of each of the following the first rigid substrate 300", the first insulating layer 200", the second insulating layer 600", the second rigid substrate 700" are removed by ultraviolet laser, routing or punching. In addition, the release layers 500 on two sides of the bending portion B can be protective layers of the flexible circuit board 100' to prevent damages therefrom during removal.

Figure 1D:
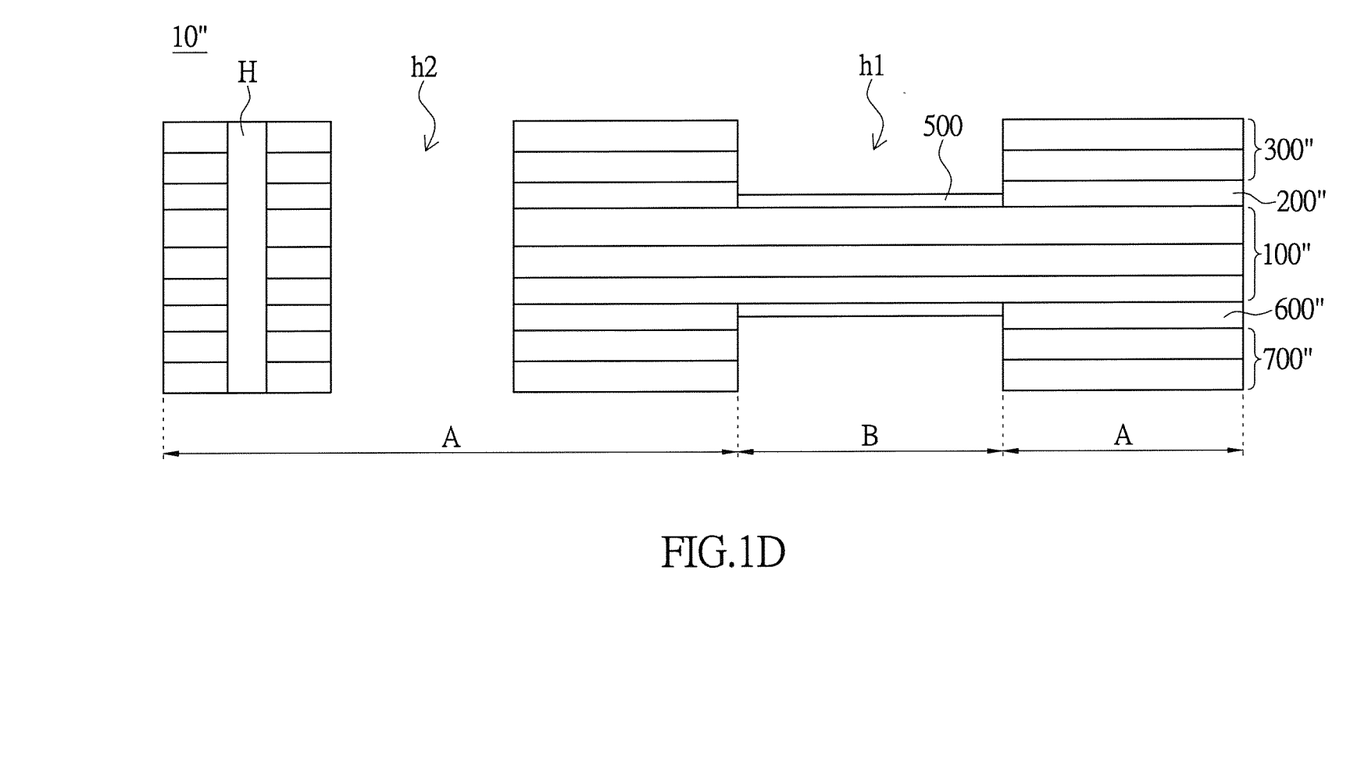

Please refer to FIG. 1D. One second opening h2 is formed in the rigid flex circuit board 10" corresponding to the position of the jointing portion A. As shown in FIG. 1D, the second opening h2 passes through the first rigid substrate 300", the first insulating layer 200", the flexible circuit board 100", the second insulating layer 600", and the second rigid substrate 700". Notably, the second opening h2 may have a cross-sectional shape of a non-point symmetric pattern such as a lightning bolt. Moreover, the second opening h2 can be formed by ultraviolet laser (UV), routing, or punching. Thereafter, forming a through hole H in the rigid flex circuit board 10". The through hole H passes through the first rigid substrate 300", the first insulating layer 200", the flexible circuit board 100', the second insulating layer 600", and the second rigid substrate 700". The through hole H is for electrically jointing the internal circuits of the rigid flex circuit board 10".

Figure 1E:
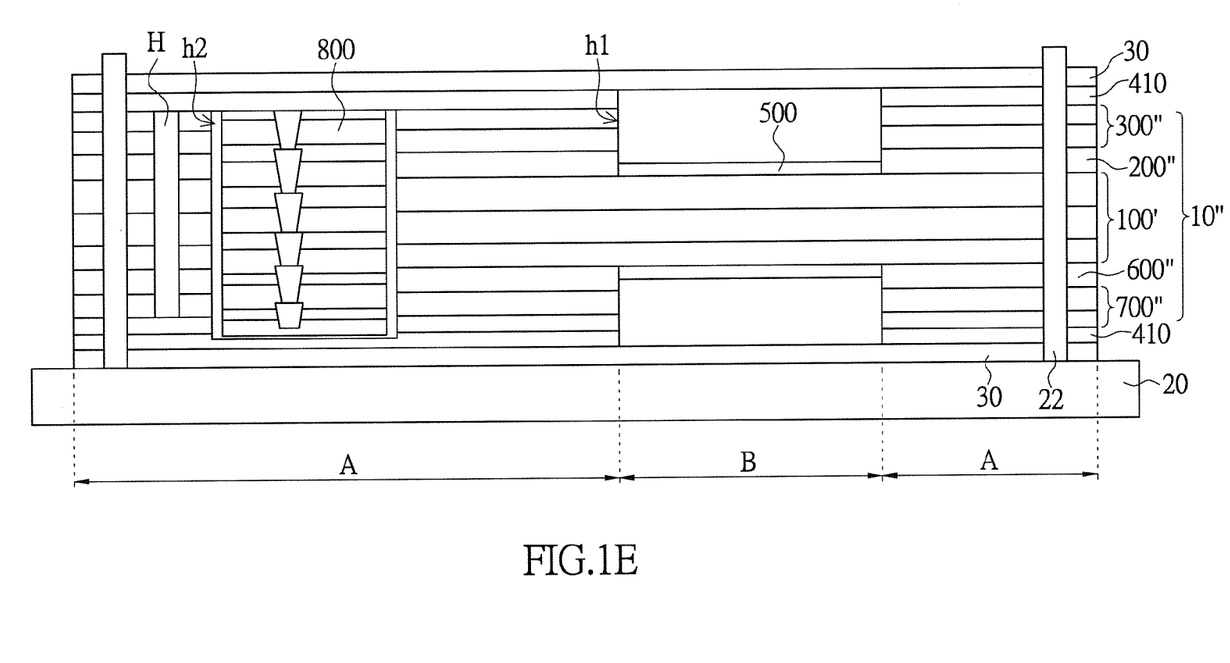

Please refer to FIG. 1E. The rigid flex circuit board 10" is disposed on a carrier 20. The carrier 20 has a plurality of fixing members 22 to fix the rigid flex circuit board 10". The fixing members 22 extend onto the first rigid circuit board 300". The carrier 20 also has a buffer material 30 and a multi-layer circuit layer 410 arranged thereon. The second rigid substrate 700" of the rigid flex circuit board 10" is attached on the multi-layer circuit layer 410.

Notably, the multi-layer circuit layer 410 includes at least one adhesive layer and at least one circuit layer (not labeled in figures), and the multi-layer circuit layer 410 has a first opening h1 parallel to the second opening h2. The adhesive layer can be made of polypropylene resin or other polymer adhesives, but not limited hereto. Furthermore, the buffer layer 30 can be made of polyethylene terephthalate (PET), but not limited hereto. The buffer layer 30 is arranged between the multi-layer circuit layer 410 and the carrier 20 to prevent attachment therebetween.

Thereafter, the high-density interconnected circuit board 800 is disposed in the second opening h2. Notably, the high-density interconnected circuit board 800 has a cross-sectional shape of a non-point symmetric patter, which is identical to the cross-sectional shape of the second opening h2, such that the high-density interconnected circuit board 800 can be fittingly align with and disposed in the second opening h2.

Furthermore, the high-density interconnected circuit board 800 is also formed by a plurality of adhesive layers, insulating layers, and circuit layers. The total number of circuit layers of the high-density interconnected circuit board 800 is larger than the total number of circuit layers of the rigid flex circuit board 10". The total number of circuit layers of the rigid flex circuit board 10" includes the total number of layers of the first rigid substrate 300", the flexible circuit board 100', and the second rigid substrate 700". In addition, as shown in FIG. 1E, one high-density interconnected circuit board 800 is in the instant embodiment, but the quantity is not limited hereto. In another embodiment, the high-density interconnected circuit board 800 can be more than one.

Notably, one high-density interconnected circuit board 800 is disposed in the rigid flex circuit board 10" in the instant embodiment. In practice, the high-density interconnected circuit board 800 and the rigid flex circuit board 10" can be separately designed. The design of the rigid flex circuit board 10" can be relatively simple and less layers. The second opening h2 is formed in the rigid flex circuit board 10" at a region where dense circuitry may be required, then separately design the high-density interconnected circuit board 800, and dispose the high-density interconnected circuit board 800 into the second opening h2. The rigid flex board module 1 of the instant disclosure can first select the high-density interconnected circuit board 800, which reduces poor installation of the high-density interconnected circuit board 800 and increases yield, whereas the conventional arts, the high-density interconnected circuit board 800 is directly design on the module to provide dense circuitry.

The other multi-layer circuit layer 410 covers on the first rigid substrate 300" and the high-density interconnected circuit board 800 such that the rigid flex circuit board 10" and the high-density interconnected circuit board 800 are arranged between the pair of multi-layer circuit layers 410. Then, the buffer layer 30 is disposed on the upper multi-layer circuit layer 410. The buffer layer 30 is to protect the multi-layer circuit layer 410. Notably, the fixing member 22 of the carrier 20 extends onto the upper multi-layer circuit layer 410 and the buffer layer 30, which fixes the multi-layer circuit layer 410 and the buffer layer 30 to the rigid flex circuit board 10", to facilitate subsequent attachment steps.

Moreover, heat is added to the adhesive layer of the multi-layer circuit layers 410 such that the adhesives fill up the first openings h1, which provides adhesion between the rigid flex circuit board 10" and the high-density interconnected circuit board 800. After heating, the adhesive layer resembles a semi-liquid form and has adhesive properties, which temporarily fixes the rigid flex circuit board 10" and the high-density interconnected circuit board 800 between the multi-layer circuit layers 410.

Figure 1F:
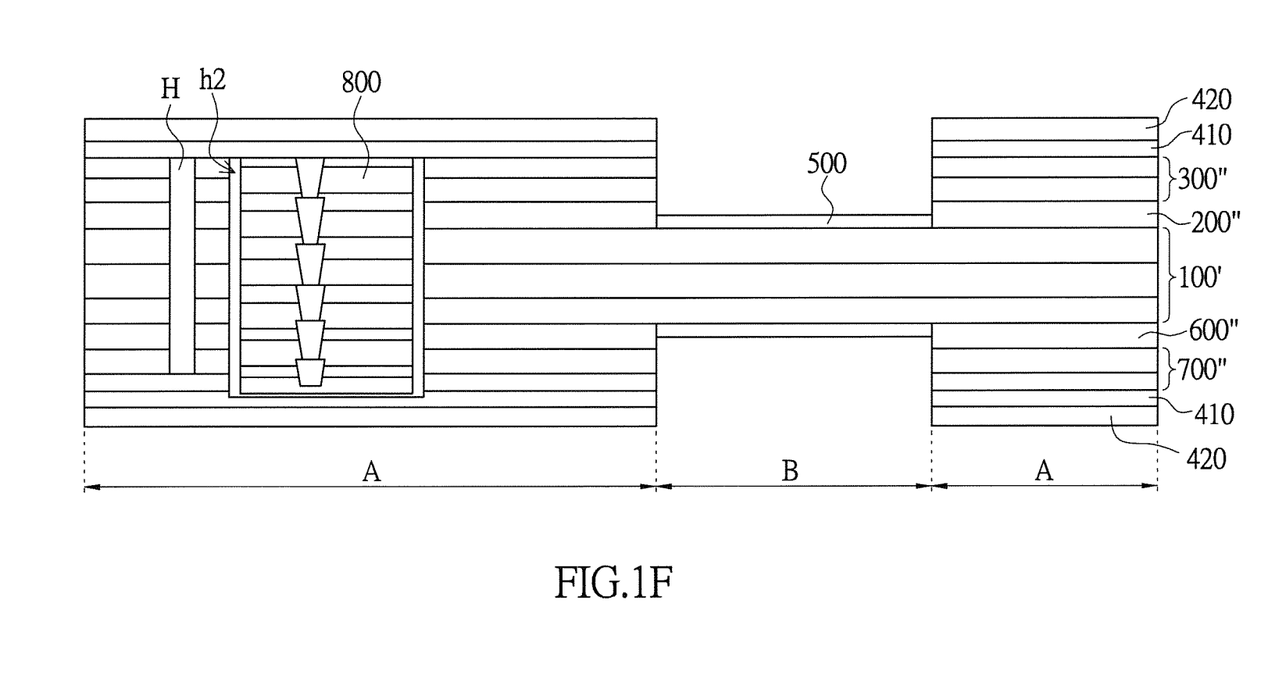

Please refer to FIG. 1F. The carrier 20 and the buffer layer 30 are removed, and a pair of multi-layer circuit layers 420 is formed on the multi-layer circuit layers 410. The multi-layer circuit layer 420 also includes at least one adhesive layer and a circuit layer (not labeled in figures, the adhesive layer is made of the same materials as the multi-layer circuit layer 410). The step where the multi-layer circuit layer 420 is formed on the multi-layer circuit layer 410 further includes the multi-layer circuit layer 420 attached on the multi-layer circuit layer 410. Thereafter, heat is added and pressed in order to fix the multi-layer circuit layers 420 on two sides of the high-density interconnected circuit board 800 and the rigid flex circuit board 10".

After heat is added and pressed, the adhesive layer solidifies due to phase transition and cannot return to the original state. Notably, when the adhesive layer is heated, portions of the adhesive layer flow to a gap between the high-density interconnected circuit board 800 and the second opening h2, such that the high-density interconnected circuit board 800 is fixed in the rigid flex circuit board 10"

Figure 1G:
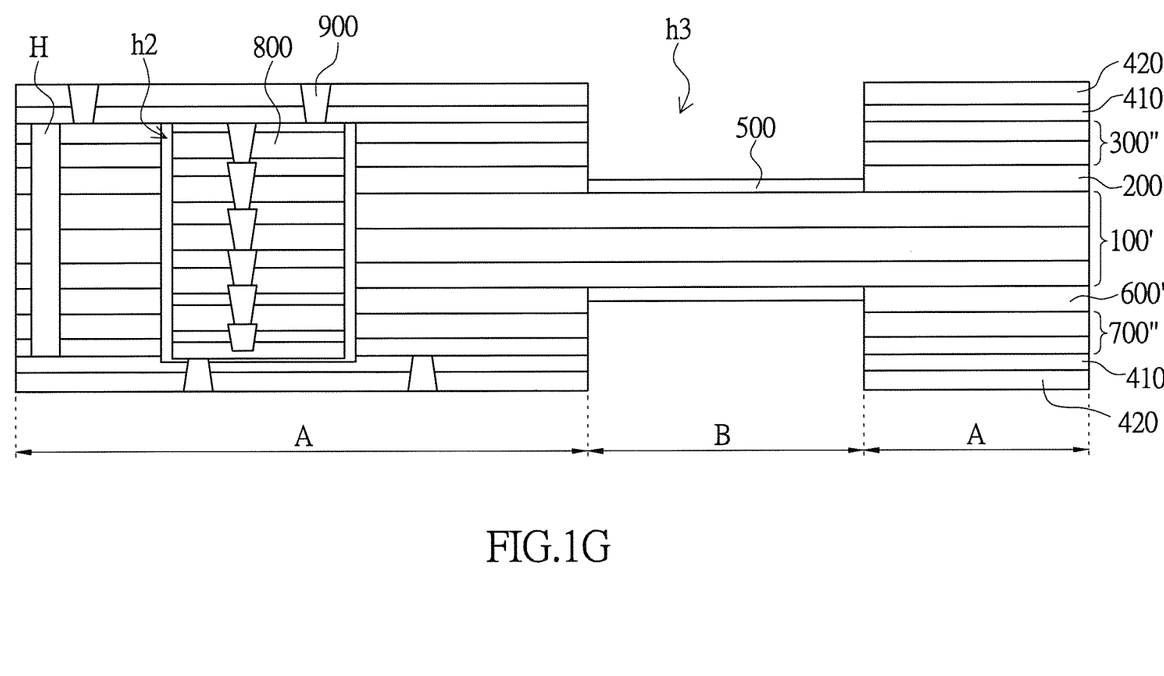

Please refer to FIG. 1G. A plurality of conductive posts 900 is formed. Conductive posts 900 can provide electrical connections between the multi-layer circuit layer 420, multi-layer circuit layer 410, rigid flex circuit board 10", and the high-density interconnected circuit board 800.

Please refer again to FIG. 1A. The release layer 500 is removed to expose the bending portion B on two sides of the flexible circuit board 100', thus forming the rigid flex board module 1. Since the bending portion B of the flexible circuit board 100' is exposed, the rigid flex board module 1 can be bent to provide rigid yet flexible properties.

In summary, in the first embodiment of the instant disclosure, firstly form the first opening h1, the second opening h2, then multi-layering are performed to form the multi-layer circuit layers 410, 420 on two sides of the rigid flex circuit board 10", thus forming the rigid flex board module 1.

Figure 2A:
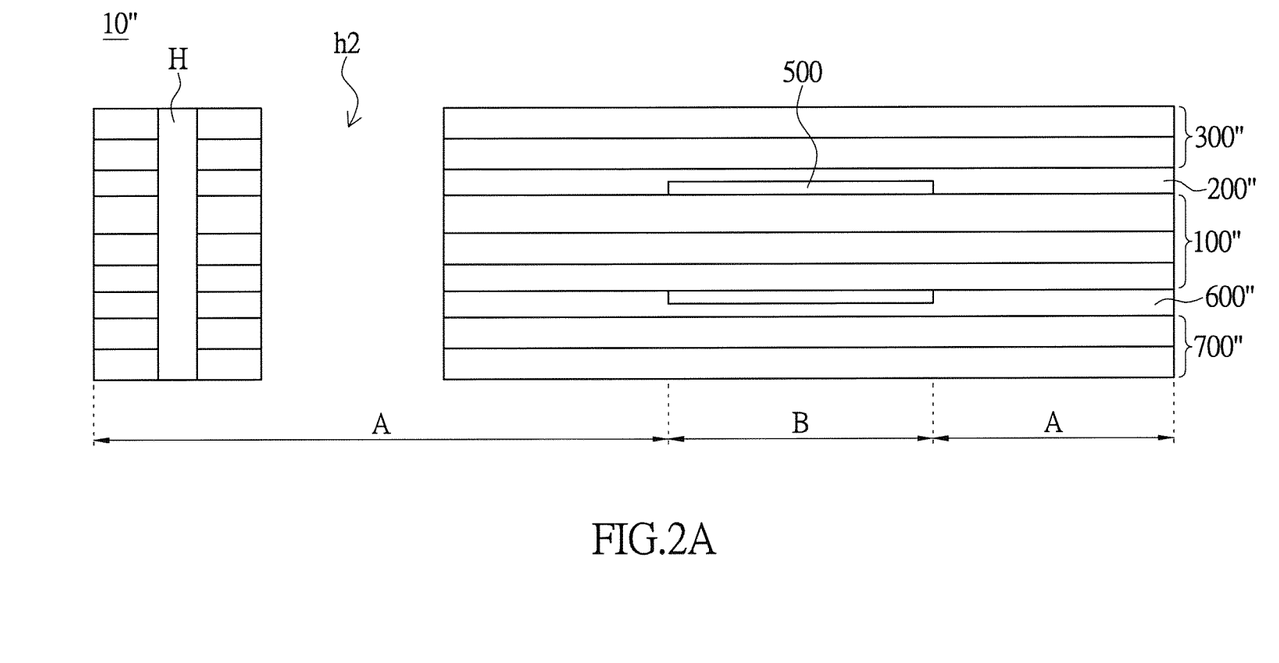
FIG. 2A to 2B are cross-sectional views of the manufacturing method for the rigid flex board module in accordance with a second embodiment of the instant disclosure.

Please refer to FIG. 2A as the continuation from FIG. 1B which provides the steps after the rigid flex initial substrate 10. Notably, the structure of the rigid flex initial substrate 10 in FIG. 2A is similar to the structure in previous embodiment.

In the instant embodiment, after one rigid flex initial substrate 10 is provided, one second opening h2 and one through hole H are formed in the rigid flex circuit board 10". The second opening h2 is correspondingly formed at the position of the jointing portion A. The second opening h2 is formed through the first rigid substrate 300", the first insulating layer 200", the flexible circuit board 100", the second insulating layer 600", and the second rigid substrate 700". The cross-sectional shape and the formation of the second opening h2 and the through hole H are similar to the previous embodiment.

Figure 2B:
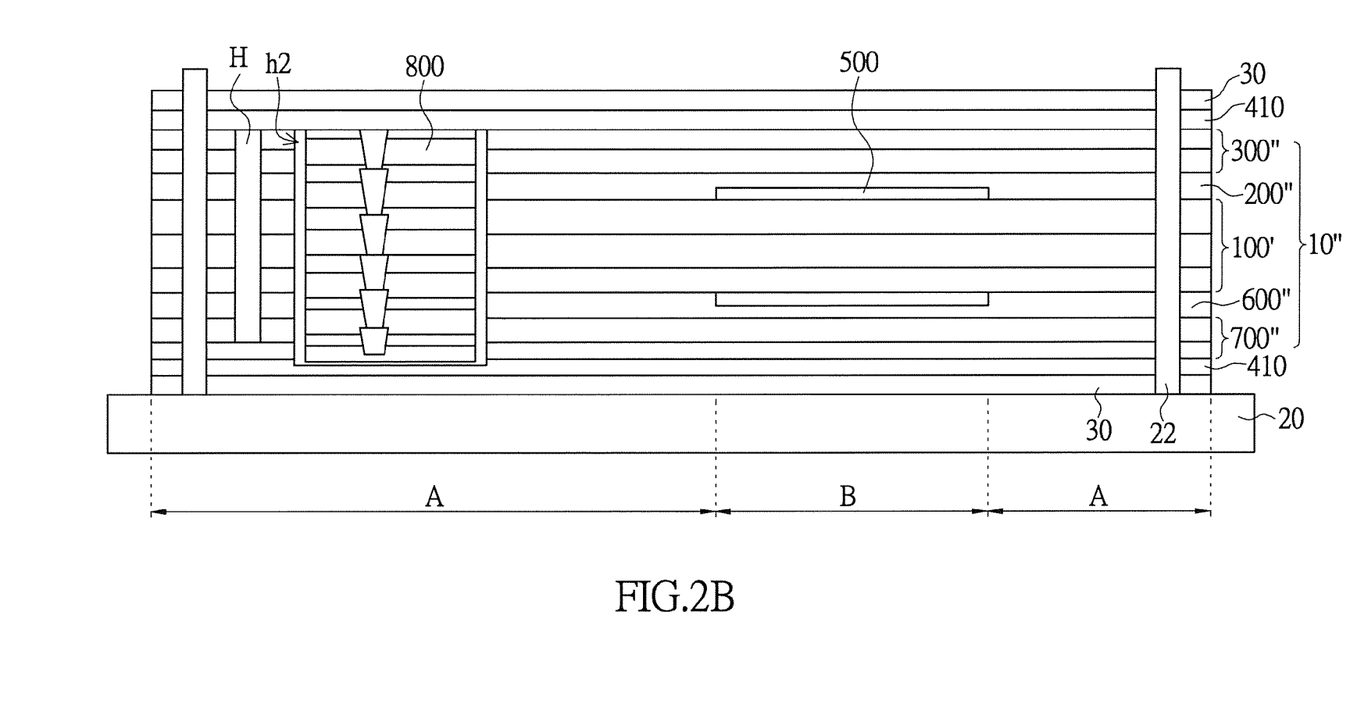

Please refer to FIG. 2B. The rigid flex circuit board 10" is disposed on one carrier 20. The carrier 20 has a plurality of fixing members 22 to fix the rigid flex circuit board 10". The carrier 20 has a buffer layer 30 and a multi-layer circuit layer 410 thereon. The rigid flex circuit board 10" is arranged above the carrier 20, and the second rigid substrate 700" of the rigid flex circuit board 10" is attached on the multi-layer circuit layer 410.

The high-density interconnected circuit board 800 is then disposed in the second opening h2. Notably, the high-density interconnected circuit board 800 has a cross-sectional shape same as the second opening h2, such that the high-density interconnected circuit board 800 can align with and fittingly disposed in the second opening h2. As shown in FIG. 2B, another multi-layer circuit layer 410 and buffer layer 30 cover over the first rigid substrate 300" and the high-density interconnected circuit board 800. Heat is then added such that the rigid flex circuit board 10" and the high-density interconnected circuit board 800 are fixed between the multi-layer circuit layers 410.

Please refer to FIG. 1A. One pair of multi-layer circuit layer 420 is formed on the multi-layer circuit layer 410. After heat is added and pressed, the multi-layer circuit layer 420 is fixed at two sides of the rigid flex circuit board 10", the high-density interconnected circuit board 800, and the multi-layer circuit layer 410. Moreover, a plurality of conductive posts 900 are formed such that the multi-layer circuit layers 420, the multi-layer circuit layers 410, the rigid flex circuit board 10", and the high-density interconnected circuit board 800 are electrically connected to each other.

Successively, a pair of first openings h1 is formed in the rigid flex initial substrate 10' corresponding to the position of the bending portion B. The pair of first openings h1 exposes the bending portion B on two sides of the flexible circuit board 100, thus forming the rigid flex board module 1. The first openings h1 can be formed by ultraviolet (UV) laser, routing, or punching. In addition, since the flexible circuit board 100' exposes the bending portion B, the rigid flex board module 1 can be bent to provide flexible yet rigid properties.

In summary, in the second embodiment of the instant disclosure, the second openings h2 are first formed, and the multi-layer circuit layers 410, 420 are formed on two sides of the rigid flex circuit board 10". Successively, the pair of first openings h1 is formed to expose the bending portion B on two sides of the flexible circuit board 100. Thus, the rigid flex board module 1 is formed.

Notably in the first embodiment of the instant disclosure, the multi-layer circuit layer 410 having the first opening h1 is pressed after the first opening h1 is formed, which is more preferred for rigid flex board module 1 having a relatively thick first rigid substrate 300", in order to reduce the poor accuracy in forming the openings or poor yield due to the relatively thick substrate. In the second embodiment, the procedure differs in that the first opening h1 is formed specifically at the position of the first opening h1 in the last step, which is more preferred for the rigid flex board module 1 having a relatively thin first rigid substrate 300".

Moreover, the first and the second embodiments of the instant disclosure differ in the sequence of forming the first opening h1, second opening h2, and the multi-layering. Other structures such as the high-density interconnected circuit board 800 are substantially the same as previous embodiment, thus not further discussed.

Figure 3:
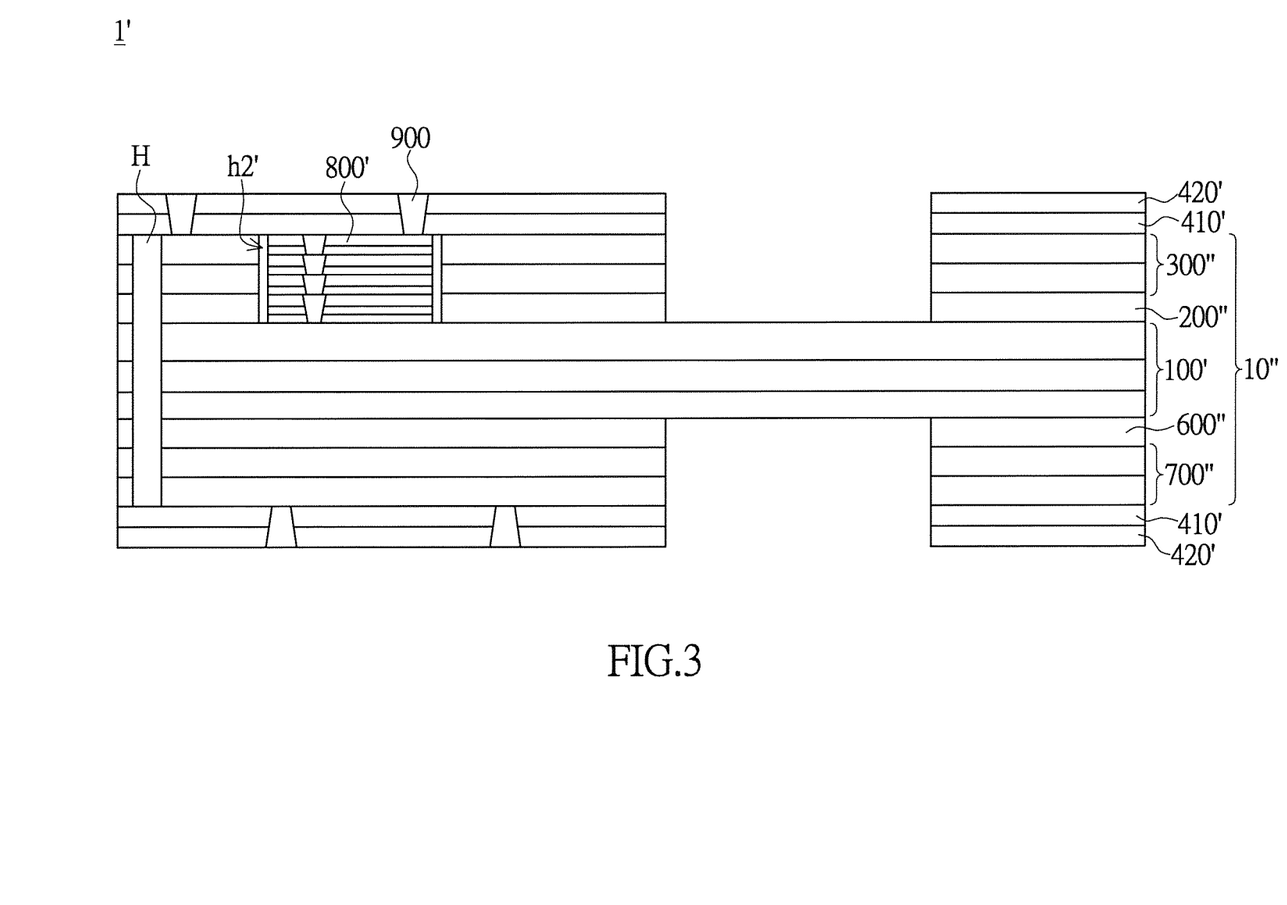
FIG. 3 is a cross-sectional view of the rigid flex board module in accordance with a second embodiment of the instant disclosure.

Please refer to FIG. 3. The structure of the rigid flex board module 1' is substantially the same as the previous embodiment, which also includes the rigid flex circuit board 10", the high-density interconnected circuit board 800, two pairs of multi-layer circuit layer 410', 420', and the plurality of conductive posts 900. The rigid flex circuit board 10" further includes the flexible circuit board 100', the first adhesive layer 200", the first rigid circuit board 300", the second adhesive layer 600", and the second rigid circuit board 700".

However, the rigid flex board module 1' of the instant embodiment differs from the rigid flex board module 1 of the first embodiment in that the rigid flex board module 1' has a first second opening h2' which passes through the first rigid circuit board 300" and the first adhesive layer 200". The high-density interconnected circuit board 800' can fittingly align with and be disposed in the second opening h2'. Notably, the total number of circuit layer of the high-density interconnected circuit board 800' is larger than the total number of circuit layer of the first rigid circuit board 300" and the first adhesive layer 200" combined. In other words, the density of circuits in the circuit layer of the high-density interconnected circuit board 800' is higher than the density of circuits in the first rigid circuit board 300" and the first adhesive layer 200" combined.

Furthermore, in another embodiment, the second opening h2' can also passes through the second adhesive layer 600", and the second rigid circuit board 700". The total number of circuit layer of the high-density interconnected circuit board 800' is larger than the total number of circuit layer of the second adhesive layer 600" and the second rigid circuit board 700" combined. The position of the high-density interconnected circuit board 800' is not limited hereto.

In summary, the instant disclosure provides a rigid flex board module a manufacturing method of the same. The rigid flex board module includes a rigid flex circuit board and a high-density interconnected circuit board. The high-density interconnected circuit board is disposed in the rigid flex circuit board in regions thereof where high density circuitry is preferred. Since the high-density interconnected circuit board and the rigid flex circuit board can be separately designed, yield rate of the rigid flex circuit board can be successively increased.

The figures and descriptions supra set forth illustrated the preferred embodiments of the instant disclosure; however, the characteristics of the instant disclosure are by no means restricted thereto. All changes, alternations, combinations or modifications conveniently considered by those skilled in the art are deemed to be encompassed within the scope of the instant disclosure delineated by the following claims.

What is claimed is:

1. A rigid flex board module, comprising:
    a rigid flex circuit board, comprising:
    a flexible circuit board including a bending portion and a jointing portion connected to the bending portion;
    a first rigid circuit board disposed on the jointing portion and exposing the bending portion, and the first rigid circuit board electrically connected to the flexible circuit board; and
    a first adhesive layer connected between the first rigid circuit board and the jointing portion;
    a high-density interconnected circuit board arranged in and electrically connected to the first rigid circuit board, wherein the total number of layers of high-density interconnected circuit board is larger than the total number of layers of the flexible circuit board;
    at least one pair of multi-layer circuit layers respectively configured at two sides of the rigid flex circuit board and two sides of the high-density interconnected circuit board; and
    a plurality of conductive posts electrically connected to the pair of multi-layer circuit layers, the high-density interconnected circuit board, and the first rigid circuit board.

2. The rigid flex board module as recited in claim 1, wherein the rigid flex circuit board further comprising:
    a second rigid circuit board disposed on the jointing portion and exposing the bending portion, and the flexible circuit board arranged between the first rigid circuit board and the second rigid circuit board; and
    a second adhesive layer connected between the second rigid circuit board and the jointing portion.

3. The rigid flex board module as recited in claim 2, wherein the high-density interconnected circuit board is arranged in and electrically connected to the first rigid circuit board, the flexible circuit board, and the second rigid circuit board.

4. The rigid flex board module as recited in claim 1, wherein the rigid flex circuit board further comprising:
    a second rigid circuit board disposed on the jointing portion and exposing the bending portion, and the flexible circuit board arranged between the first rigid circuit board and the second rigid circuit board; and
    a second adhesive layer connected between the second rigid circuit board and the jointing portion.

5. The rigid flex board module as recited in claim 4, wherein the high-density interconnected circuit board is arranged in and electrically connected to the first rigid circuit board, the flexible circuit board, and the second rigid circuit board.

6. The rigid flex board module as recited in claim 1, wherein the flexible circuit board has a plurality of the jointing portion, and one bending portion is arranged between two jointing portions.

* * * * *